United States Patent [19]

Itagaki et al.

[11] Patent Number: 5,496,619

[45] Date of Patent: Mar. 5, 1996

[54] ASSEMBLY FORMED FROM CONDUCTIVE PASTE AND INSULATING PASTE

[75] Inventors: Minehiro Itagaki, Moriguchi; Kazuyuki Okano, Ikoma; Suzushi Kimura, Toyonaka; Seiichi Nakatani, Hirakata; Yoshihiro Bessho, Higashiosaka; Satoru Yuhaku, Osaka; Yasuhiko Hakotani, Nishinomiya; Kazuhiro Miura, Osaka, all of Japan

[73] Assignee: Matsushita Electric Industrial Co., Ltd., Japan

[21] Appl. No.: 254,414

[22] Filed: Jun. 6, 1994

Related U.S. Application Data

[62] Division of Ser. No. 59,959, May 13, 1993, abandoned.

[30] Foreign Application Priority Data

May 14, 1992 [JP] Japan ................. 4-121610
Sep. 22, 1992 [JP] Japan ................. 4-252596

[51] Int. Cl.⁶ .............. B32B 15/04; B32B 17/06; H01L 21/4763; H01B 1/16
[52] U.S. Cl. .............. 428/209; 252/512; 252/513; 252/514; 252/518; 252/519; 257/700; 428/901; 428/469; 428/432; 428/433; 428/434; 428/427; 428/428; 174/137 B; 174/257; 501/19; 501/20
[58] Field of Search ................. 437/218, 247; 361/793; 29/851, 875, 878, 879; 257/700; 428/432, 433, 434, 427, 428, 209, 457, 469, 497–499, 701, 702, 901; 427/96, 97, 126.1, 126.2; 252/512, 513, 514, 518, 519; 106/1.13, 1.21, 1.26; 174/137 B, 257

[56] References Cited

U.S. PATENT DOCUMENTS

| | | | |
|---|---|---|---|
| 3,640,738 | 2/1972 | Detweiler et al. | 501/67 |
| 4,234,367 | 11/1980 | Herron et al. | 427/96 X |
| 4,301,324 | 11/1981 | Kumar et al. | 174/256 |
| 4,419,279 | 12/1983 | Abrams | 252/514 |
| 4,424,251 | 1/1984 | Sugishita et al. | 428/432 X |
| 4,464,420 | 8/1984 | Taguchi et al. | 427/96 |
| 4,490,429 | 12/1984 | Tosaki et al. | 428/195 |
| 4,598,167 | 7/1986 | Ushifusa et al. | 252/514 |
| 4,699,888 | 10/1987 | Dumesnil et al. | 252/514 |
| 4,714,570 | 12/1987 | Nakatani et al. | 252/518 |
| 4,732,798 | 3/1988 | Ishida et al. | 428/432 X |
| 4,810,528 | 3/1989 | Kondo et al. | 427/96 |
| 4,874,550 | 10/1989 | Prabhu et al. | 252/521 |
| 4,877,555 | 10/1989 | Yuhaku et al. | 252/518 X |
| 4,894,184 | 1/1990 | Fukuoka et al. | 252/512 |
| 4,904,415 | 2/1990 | Lau | 252/514 |
| 5,118,643 | 6/1992 | Jean et al. | 428/901 X |
| 5,270,268 | 12/1993 | Jean et al. | 428/427 X |
| 5,283,104 | 2/1994 | Aoude et al. | 428/195 |
| 5,336,301 | 8/1994 | Tani et al. | 252/518 X |

FOREIGN PATENT DOCUMENTS

| | | | |
|---|---|---|---|
| 0133010 | 2/1985 | European Pat. Off. | |
| 0396806 | 11/1990 | European Pat. Off. | |
| 3115556 | 2/1982 | Germany | |
| 58-124248 | 7/1983 | Japan | 427/218 |
| 62-79691 | 4/1987 | Japan | |
| 4-49277 | 8/1992 | Japan | |
| 9305632 | 3/1993 | WIPO | |

*Primary Examiner*—Douglas J. McGinty
*Attorney, Agent, or Firm*—Wenderoth, Lind & Ponack

[57] ABSTRACT

Conductive paste for via connection of a multilayer ceramic substrate, comprising: an inorganic component which consists of 30.0 to 70.0% by weight of powder of conductive material and the remainder being one of glass powder having a softening point higher than a starting point of sintering of insulating material and crystalline glass ceramic powder having a glass transition point higher than the starting point of sintering of the insulating material; and an organics vehicle component which consists of at least organic binder and solvent.

4 Claims, 3 Drawing Sheets

ASSEMBLY FORMED FROM CONDUCTIVE PASTE AND INSULATING PASTE

This application is a divisional of now abandoned application, Ser. No. 08/059,959, filed May 13, 1993.

BACKGROUND OF THE INVENTION

The present invention relates to conductive paste for a via connection employed in production of multilayer ceramic substrates on which LSI, IC or chip components are mounted.

In order to produce multilayer ceramic substrates, the green sheet process and printing process are known and are widely used. The green sheet process has advantages such that a large number of layers can be stacked and fine circuit patterns can be formed but is disadvantageous in that production yield is low and flexibility for changes of circuit patterns is poor. On the other hand, the printing process has merits such that the process is simple, flexibility for changes of circuit patterns is excellent and production yield is high. However, the printing process has drawbacks such that a large number of layers cannot be stacked due to uneven portions formed on the surface of the substrate by the circuit patterns and fine circuit patterns cannot be formed. By incorporating the advantages of these two known processes, a hot stamping process has been proposed in which a hot stamping sheet having a circuit pattern embedded in an insulating layer is stamped and laminated on a ceramic substrate.

Meanwhile, a vital point in technology for producing multilayer ceramic substrates resides in a technique for connecting circuit layers. Generally, in order to connect the circuit layers, holes called "via holes" are formed at predetermined locations on a circuit and conductive material is filled into the via holes. In the green sheet process and hot stamping process, insulating and conductive layers are laminated on one another so as to be formed integrally with each other and then, are fired simultaneously. Therefore, in the known processes, a problem arises such that if firing of the conductive material in the via holes and firing of insulating material bounding peripheries of the via holes are not synchronized with each other accurately, a circuit is disconnected from the via conductor or gaps are produced in the via holes, thereby resulting in extreme deterioration of reliability of a connection.

SUMMARY OF THE INVENTION

Accordingly, an essential object of the present invention is to provide a conductive paste for a multilayer ceramic substrate in which a conductive layer, via conductor and an insulating layer defining a via hole are held in close contact with each other.

In order to accomplish this object of the present invention, the conductive paste for a via connection of a multilayer ceramic substrate, according to the present invention comprises: an inorganic component which consists of 30.0 to 70.0% by weight of powder of conductive material and the remainder being one of glass powder having a softening point higher than a starting point of sintering of the insulating material and crystalline glass ceramic powder having a glass transition point higher than than the starting point of sintering of the insulating material; and an organic vehicle component which consists of at least organic binder and solvent.

Therefore, after the insulating layer defining the via hole has been sintered during a burning step so as to define the via hole, glass contained in the via conductor is softened and molten such that the via conductor is sintered. As a result, disconnection of the via connector neither occurs nor a gap in the via hole is formed. Consequently, in accordance with the present invention, the via conductor is of such a dense construction as to be securely brought into close contact with a periphery of the via hole.

BRIEF DESCRIPTION OF THE DRAWINGS

This object and features of the present invention will become apparent from the following description taken in conjunction with the preferred embodiment thereof with reference to the accompanying drawings, in which:

FIG. 3b is a graph showing temperature profile in sintering and firing steps in the production process of FIG. 3a;

FIG. 3c is a graph showing temperature profile in a further binder burn-out step in the production process of FIG. 3a;

FIG. 3d is a graph showing temperature profile in a reduction step in the production process of FIG. 3a.

DETAILED DESCRIPTION OF THE INVENTION

Figure 1:
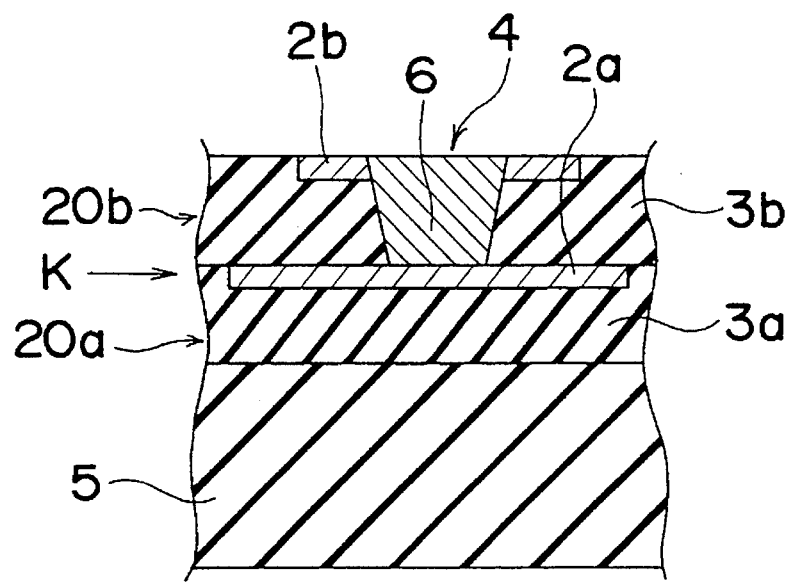
FIG. 1 is a fragmentary schematic sectional view of a multilayer ceramic substrate according to one embodiment of the present invention.
Figure 2:
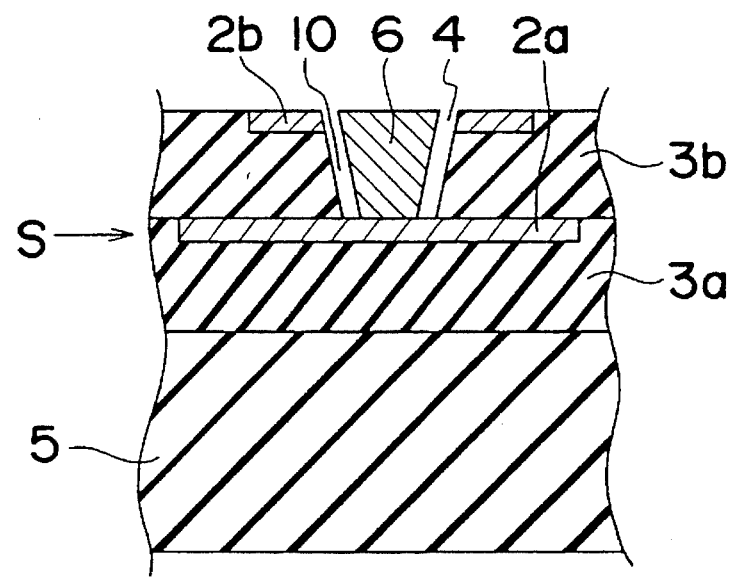
FIG. 2 is a fragmentary sectional view of a multilayer ceramic substrate which is a comparative example of the multilayer ceramic substrate of FIG. 1.

Referring now to the drawings, FIG. 1 shows a multilayer ceramic substrate K according to one embodiment of the present invention, while FIG. 2 shows a multilayer ceramic substrate S which is a comparative example of the multilayer ceramic substrate K of FIG. 1. Meanwhile, FIGS. 3a to 3d show temperature profiles in respective steps of a production process of the multilayer ceramic substrate K of FIG. 1.

[EXAMPLE 1]

Production of the multilayer ceramic substrate K is described with reference to FIGS. 4a to 4h, hereinbelow. The multilayer ceramic substrate K includes a plurality of, for example, two hot stamping sheets 20a and 20b as shown in FIG. 1. However, needless to say, the multilayer ceramic substrate K may include three or more hot stamping sheets. As material of via conductive paste 8 for via conductor 6, 41.7% by weight of Ag powder having an average particle size of about 1 micron, 41.7% by weight of glass powder "GA13" (brand name of Nippon Electric Glass Co., Ltd. of Japan) having a softening point of 850° C., 0.8% by weight of ethyl cellulose resin acting as organic binder and 15.8% by weight of α-terpineol acting as solvent are prepared. By mixing and kneading these components sufficiently by a roll mill, the via conductive paste 8 for the via conductor 6 is obtained.

Meanwhile, as material of an insulating paste for an insulating layer 3, 70% by weight of insulating powder including alumina powder and borosilicate glass powder, 7.5% by weight of butyral resin acting as organic binder, 7.5% by weight of benzyl butylphthalate acting as plasticizer and 15% by weight of butylcarbinol acting as solvent are prepared. By mixing and kneading these components to full extent by a roll mill, the insulating paste for the insulating layer 3 is obtained. Measurement based on TMA (thermal mechanical analysis) has revealed that the insulating powder starts shrinkage at 630° C. due to heating and terminates shrinkage at 850° C. Hence, starting point of sintering of the insulating powder is 630° C.

Figure 4A:
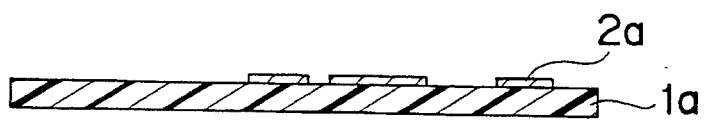
FIGS. 4a to 4h are schematic sectional views showing steps of the production process of the multilayer ceramic substrate of FIG. 1.
Figure 4B:
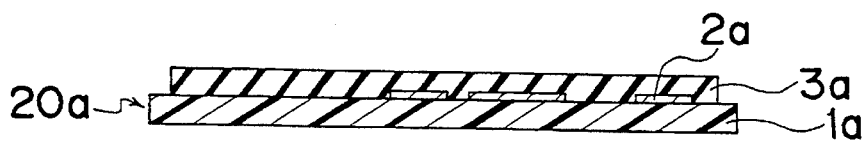

Initially, a base film 1a made of polyethylene terephthalate (PET) is subjected, on its surface, to parting treatment. Then, a circuit pattern (conductive layer) 2a is formed on the base film 1a by conductive paste "DD1411" (brand name of Kyoto Elex Co., Ltd. of Japan) through screen printing as shown in FIG. 4a. Furthermore, the insulating layer 3a is formed on the conductive layer 2a by the above mentioned insulating paste so as to cover the whole of the conductive layer 2a and thus, the first hot stamping sheet 20a is produced as shown in FIG. 4b.

Figure 4C:
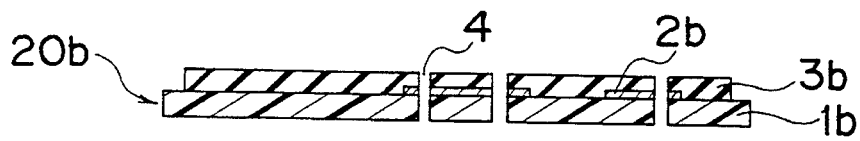

Meanwhile, the second hot stamping sheet 20b prepared by the same sequence as the first hot stamping sheet 20a includes a base film 1b, a conductive layer 2b and an insulating layer 3b. In addition, via holes 4 are formed at predetermined locations of the second hot stamping sheet 20b by punching as shown in FIG. 4c. Meanwhile, the via holes 4 may be formed by a carbon dioxide gas laser.

Figure 4D:
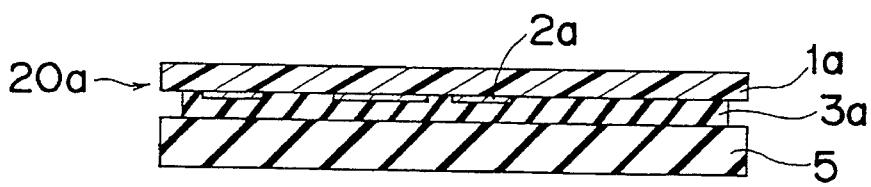
Figure 4E:
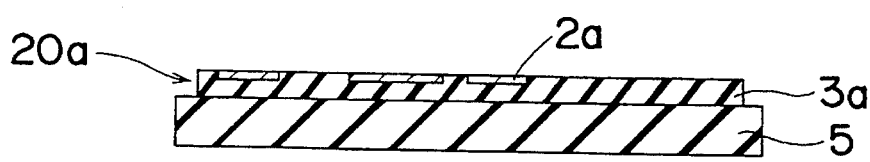
Figure 4F:
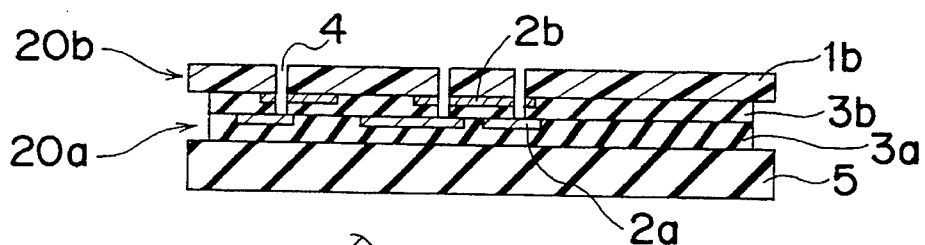
Figure 4G:
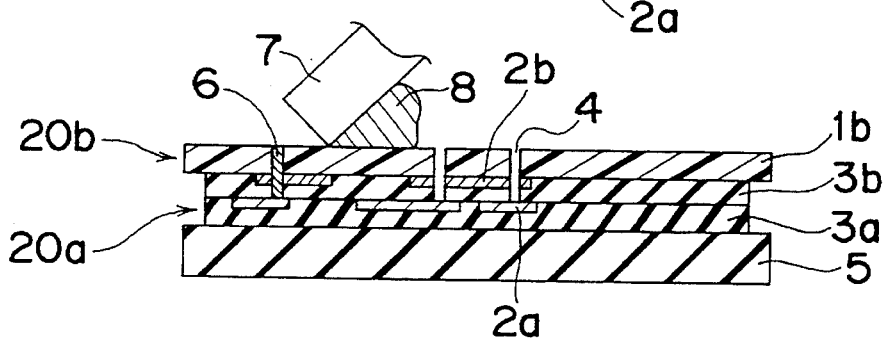
Figure 4H:
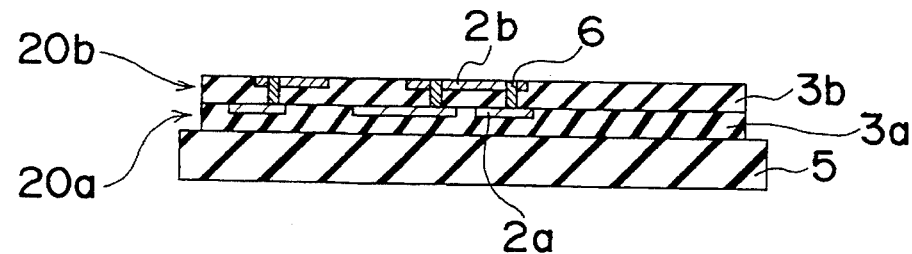

Thereafter, as shown in FIG. 4d, the first hot stamping sheet 20a is subjected to hot stamping on a sintered substrate 5 containing 96% alumina under conditions of 60° C. and 80 kg/mm$^2$ such that the insulating layer 3a is attached to the substrate 5. Subsequently, the base film 1a is stripped from the first hot stamping sheet 20a as shown in FIG. 4e. Then, the second hot stamping sheet 20b is laminated on the first hot stamping sheet 20a such that the insulating layers 3a and 3b of the first and second stamping sheets 20a and 20b confront each other as shown in FIG. 4f. Subsequently, the prepared via conductive paste 8 is filled by a squeegee 7 into the via holes 4 of the second hot stamping sheet 20b so as to form the via conductor 6 in the via holes 4 as shown in FIG. 4g and then, the base film 1b is stripped from the second hot stamping sheet 20b as shown in FIG. 4h. Thus, the multilayer ceramic substrate K is obtained as shown in FIG. 1.

Figure 3A:
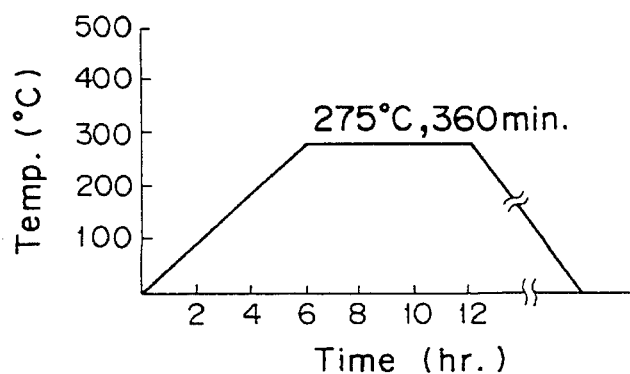
FIG. 3a is a graph showing temperature profile in a binder burn-out step in a production process of the multilayer ceramic substrate of FIG. 1.
Figure 3B:
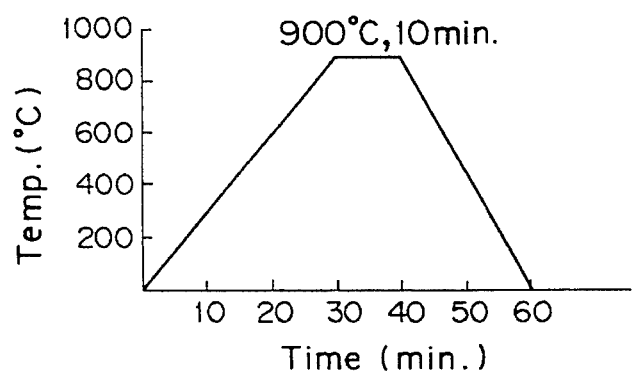

The obtained multilayer ceramic substrate K is subjected to binder burn-out in atmosphere in a heating furnace. Heating conditions at this time form a temperature profile having a peak temperature of 275° C. and a peak temperature period of 360 min. as shown in FIG. 3a. Subsequently, the multilayer ceramic substrate K is sintered and fired in atmosphere in the heating furnace. Heating conditions at this time form a temperature profile having a peak temperature of 90° C. and a peak temperature period of 10 min. as shown in FIG. 3b. In the via holes 4 of the thus obtained multilayer ceramic substrate K, disconnection of the via conductor 6 from its contact portions of the conductive layers 2a and 2b neither occurs nor a gap is formed. As a result, the via conductor 6 is of such a dense construction as to be securely brought into close contact with peripheries of the via holes 4. The material of the via conductor 6 has a volume resistivity of $3.7 \times 10^{-4}$ Ω.cm.

As the comparative example of the multilayer ceramic substrate K, when the multilayer ceramic substrate S is produced by replacing glass contained in the via conductive paste 8 by material "GA1" (brand name of Nippon Electric Glass Co., Ltd. of Japan) having a softening point of 600° C., the via conductor 6 is sintered in a pillarlike shape as shown in FIG. 2 and thus, a gap 10 exists between the via conductor 6 and its contact portion of the conductive layer 2b. Close observation has shown that the insulating material forming the insulating layers 3a and 3b adheres to an outer periphery of the via conductor 6 sintered in a pillarlike shape. This defect may be caused by the fact that glass contained in the via conductor 6 softens and melts prior to sintering of the insulating material.

Meanwhile, other multilayer ceramic substrates are produced by the changing ratio of Ag and glass in the via conductive paste 8. At this time, when the via conductive paste 8 contains less than 30% by weight of Ag, namely, glass content is large, the construction of via connection shown in FIG. 1 is obtained but electrical connection is not achieved due to excessively large glass content. On the other hand, when the via conductive paste 8 contains more than 70% by weight of Ag, namely, Ag content is large, the construction of the via connection shown in FIG. 2 is obtained.

[EXAMPLE 2]

As material of the via conductive paste 8 for the via conductor 6, 41.7% by weight of CuO powder "CB250" (brand name of Kyoto Elex Co., Ltd. of Japan) having an average particle size of about 1 to 3 microns, 41.7% by weight of glass powder "GA13" (brand name of Nippon Electric Glass Co., Ltd. of Japan) having a softening point of 850° C., 0.8% by weight of ethyl cellulose resin acting as organic binder and 15.8% by weight of α-terpineol acting as solvent are prepared. By mixing and kneading these components sufficiently by a roll mill, the via conductive paste 8 for the via conductor 6 is obtained.

As material of conductive paste for the conductive layer 2, 85.5% by weight of CuO powder "CB250" (brand name of Kyoto Elex Co., Ltd. of Japan) having an average particle size of 1 to 3 microns, 5.8% by weight of butyral resin acting as organic binder, 5.7% by weight of benzyl butylphthalate acting as plasticizer and 3% by weight of butylcarbinol acting as solvent are prepared. By mixing and kneading these components to full extent by a roll mill, the conductive paste for the conductive layer 2 is obtained. The same insulating paste for the insulating layer 3 as that of the above Example 1 is employed.

The base film 1a made of polyethylene terephthalate (PET) is subjected, on its surface, to parting treatment. Then, the circuit pattern (conductive layer) 2a is formed on the base film 1a by the conductive paste through screen printing. Furthermore, the insulating layer 3a is formed by the prepared insulating paste so as to cover a whole of the conductive layer 2a and thus, the first hot stamping sheet 20a is produced as in the Example 1. In the same manner as in the Example 1, the via holes 4 are formed at predetermined locations of the second hot stamping sheet 20b by a carbon dioxide gas laser. Meanwhile, the via holes 4 may be formed by punching. Subsequently, the first hot stamping sheet 20a is subjected to hot stamping on the sintered substrate 5 containing 96% alumina under conditions of 60° C. and 80 kg/mm$^2$. After the base film 1a has been stripped from the first hot stamping sheet 20a, the second hot stamping sheet 20b is laminated on the first hot stamping sheet 20a and then, the prepared via conductive paste 8 for the via connector 6 is filled by the squeegee 7 into the via holes 4 so as to form the via conductor 6 in the via holes 4. Subsequently, the base film 1b is stripped from the second hot stamping sheet 20b and thus, the multilayer ceramic substrate K is obtained as shown in FIG. 1.

Figure 3C:
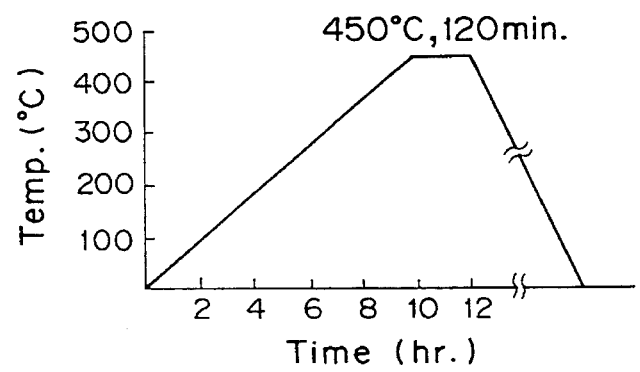
Figure 3D:
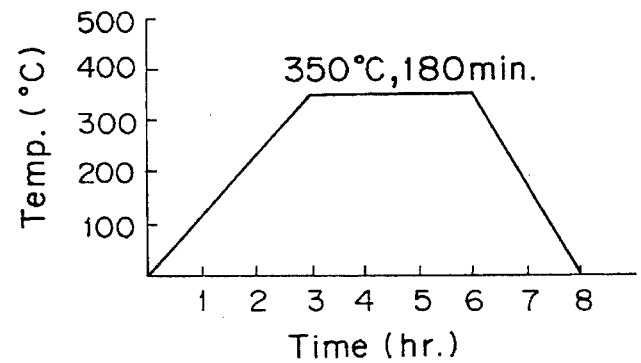

The obtained multilayer ceramic substrate K is subjected to binder burn-out in atmosphere in the heating furnace. Heating conditions at this time form a temperature profile having a peak temperature of 450° C. and a peak temperature period of 120 min. as shown in FIG. 3c. Thereafter, reduction of CuO, i.e. conductor in the multilayer ceramic substrate K is performed in atmosphere of hydrogen gas in the heating furnace. Heating conditions at this time form a temperature profile having a peak temperature of 350° C. and a peak temperature period of 180 min. as shown in FIG. 3d. Furthermore, the multilayer ceramic substrate K is sintered and fired in atmosphere of nitrogen gas in the heating furnace. Heating conditions at this time form the temperature profile having a peak temperature of 900° C. and a peak temperature period of 10 min. as shown in FIG. 3b. In the via holes 4 of the thus obtained multilayer ceramic substrate K, disconnection of the via connector 6 from its contact portions of the conductive layers 2a and 2b neither occurs nor a gap is formed. As a result, the via conductor 6 is of such a dense construction as to be securely brought into close contact with peripheries of the via holes 4. Material of the via conductor 6 has a volume resistivity of $9.4 \times 10^{-4}$ $\Omega$.cm.

As a comparative example of the multilayer ceramic substrate K, when the multilayer ceramic substrate S is produced by replacing glass contained in the via conductive paste 8 by material "GA1" (brand name of Nippon Electric Glass Co., Ltd. of Japan) having a softening point of 600° C., the same results as those of the comparative example in the Example 1 are obtained.

Meanwhile, other multilayer ceramic substrates are produced by changing ratio of CuO and glass in the via conductive paste 8. At this time, when the via conductive paste 8 contains less than 30% by weight of CuO, namely, glass content is large, the construction of via connection shown in FIG. 1 is obtained but electrical connection is not achieved owing to extremely large glass content. On the other hand, when the via conductive paste 8 contains more than 70% by weight of CuO, namely, Cu content is large, the construction of via connection shown in FIG. 2 is obtained.

[EXAMPLE 3]

In place of the via conductive paste 8 used in the Examples 1 and 2, 41.7% by weight of RuO$_2$ powder (procured from Tanaka Kikinzoku International K.K. of Japan) having an average particle size of about 1 micron, 41.7% by weight of glass powder "GA13" (brand name of Nippon Electric Glass Co., Ltd. of Japan) having a softening point of 850° C., 0.8% by weight of ethyl cellulose resin acting as organic binder and 15.8% by weight of α-terpineol acting as solvent are prepared. By mixing and kneading these components sufficiently by a roll mill, the conductive paste 8 for the via conductor 6 is obtained.

By using the via conductive paste 8, the multilayer ceramic substrate K is obtained as shown in FIG. 1. In the via holes 4 of the thus produced multilayer ceramic substrate K, disconnection of the via conductor 6 from its contact portions of the conductive layers 2a and 2b neither occurs nor a gap is formed. As a result, the via conductor 6 is of such a dense construction as to be securely brought into close contact with peripheries of the via holes 4. The material of the via conductor 6 has a volume resistivity of $4.5 \times 10^{-3}$ $\Omega$.cm in the case of firing in atmosphere as in the Example 1 and a volume resistivity of $2.3 \times 10^{-3}$ $\Omega$.cm in the case of firing in atmosphere of nitrogen gas as in the Example 2.

Meanwhile, in the Examples 1 to 3, the insulating layers 3 have a starting point of 630° C. of sintering, while glass in the via conductor 6 has a softening point of 850 ° C. As far as glass in the via conductor 6 has a softening point of not less than 630° C., the glass is not restricted in composition, etc. at all. However, it will be easily understood that from standpoints of characteristics such as strength, insulating resistance, circuit resistance and reliability, the glass should has such a property to start softening and melting at a temperature of not more than the firing temperature required of the insulating layers 3 and the conductive layers 2, i.e., at a temperature of not more than 900° C. in the Examples 1 to 3.

[EXAMPLE 4]

By employing material "FE1" (trial product of Nippon Electric Glass Co., Ltd. of Japan) having a softening point of 650° C. in place of the glass in the via conductive paste 8 in the Examples 1 to 3, the conductive via paste 8 is likewise produced. Then, by employing insulating powder including alumina, quartz and lead borosilicate glass and having a staring point of 580° C. of sintering in place of the insulating powder used in the Examples 1 to 3, the insulating paste for the insulating layers 3 is produced. Then, by setting the firing temperature to 850° C., the multilayer ceramic substrate K is produced in the same manner as in the Examples 1 to 3. Via connection in the obtained multilayer ceramic substrate K has shape, construction and properties identical with those of the Examples 1 to 3.

[EXAMPLE 5]

In place of the via conductive paste 8 used in the Example 1, 50.0% by weight of Ag powder having an average particle size of about 3 microns and procured from Fukuda Metal Foil & Powder Co., Ltd. of Japan, 33.4% by weight of crystalline glass ceramic powder "MLS05" (brand name of Nippon Electric Glass Co., Ltd. of Japan) having a glass transition point of 660° C., 0.8% by weight of ethyl cellulose resin acting as organic binder and 15.8% by weight of α-terpineol acting as solvent are prepared. By mixing and kneading these components sufficiently by a roll mill, the via conductive paste 8 is obtained. Then, by using the via conductive paste 8, the multilayer ceramic substrate K is produced. In the via holes 4 of the obtained multilayer ceramic substrate K, disconnection of the via conductor 6 from its contact portions of the conductive layers 2 neither occurs nor a gap is formed. Consequently, in the same manner as in the Example 1, the via conductor 6 is of such a dense construction as to be securely brought into close contact with peripheries of the via holes 4. The material of the via conductor 6 has a volume resistivity of $2.5 \times 10^{-4}$ $\Omega$.cm.

[EXAMPLE 6]

In place of the via conductive paste 8 used in the Example 2, 50.0% by weight of CuO powder "CB250" (brand name of Kyoto Elex Co., Ltd. of Japan) having an average particle size of about 3 microns, 33.4% by weight of crystalline glass ceramic powder "MLS05" (brand name of Nippon Electric Glass Co., Ltd. of Japan) having a glass transition point of 660° C., 0.8% by weight of ethyl cellulose resin acting as an organic binder and 15.8% by weight of α-terpineol acting as solvent are prepared. By mixing and kneading these components to full extent by a roll mill, the via conductive paste 8 is obtained. Then, by using the via conductive paste 8, the multilayer ceramic substrate K is produced. In the via holes 4 of the thus produced multilayer ceramic substrate K, disconnection of the via conductor 6 from its contact portions of the conductive layers 2 neither occurs nor a gap is formed. Accordingly, the via conductor 6 is of such a dense construction as to be securely brought into close contact with peripheries of the via holes 4. The material of the via conductor 6 has a volume resistivity of $3.0 \times 10^{-4}$ Ω.cm.

[EXAMPLE 7]

In place of the via conductive paste 8 used in the Example 3, 50.0% by weight of $RuO_2$ powder (procured from Tanaka Kikinzoku International K.K. of Japan) having an average particle size of about 1 micron, 33.4% by weight of crystalline glass ceramic powder "MLS05" (brand name of Nippon Electric Glass Co., Ltd. of Japan) having a glass transition point of 660° C., 0.8% by weight of ethyl cellulose resin acting as organic binder and 15.8% by weight of α-terpineol acting as solvent are prepared. By mixing and kneading these components sufficiently by a roll mill, the via conductive paste 8 is obtained.

By using the via conductive paste 8, the multilayer ceramic substrate K is produced. In the via holes 4 of the thus produced multilayer ceramic substrate K, disconnection of the via conductor 6 from its contact portions of the conductive layers 2 neither occurs nor a gap is formed. As a result, in the same manner as in the Example 3, the via conductor 6 is of such a dense construction as to be securely brought into close contact with peripheries of the via holes 4. The material of the via conductor 6 has a volume resistivity of $7.0 \times 10^{-3}$ Ω.cm in the case of firing in atmosphere and a volume resistivity of $3.5 \times 10^{-3}$ Ω.cm in the case of firing in an atmosphere of nitrogen gas.

In the foregoing Examples 1 to 7, the insulating layers 3 are made of material in which alumina acting as filler is added to borosilicate glass. This borosilicate glass includes lead borosilicate glass and calcium borosilicate glass but may be replaced by glass having the property of electrical insulation. Furthermore, the filler may be replaced by a material having excellent electrical insulation, for example, quartz, forsterite, etc.

Meanwhile, Ag, CuO, Ru and $RuO_2$ are employed as the via conductor 6 in the foregoing. However, on the basis of kinds of the insulating layers 3 and the conductive layers 2 and heat treatment conditions determined by these kinds, the via conductor 6 may also be selectively made of Pd, Ag-Pd, Pt, Pt-Pd, Cu, Au, Ni, etc.

Moreover, needless to say, in addition to the hot stamping process in this embodiment, the green sheet process may be employed for lamination. Consequently, the present invention can be widely applied to not only the multilayer ceramic substrate but electronic components requiring electrical connection between circuits.

What is claimed is:

1. An assembly comprising a multilayer ceramic substrate having an insulating material formed of an insulating paste comprising an insulating powder and a via connection formed of a conductive paste extending within said insulating material, said conductive paste comprising:

an inorganic component which consists of 30.0 to 50.0% by weight of a powder of a conductive material and the remainder being a glass powder having a softening point higher than the starting point of sintering of said insulating powder; and an organic vehicle component which comprises an organic binder and solvent.

2. Conductive paste as claimed in claim 1, wherein the conductive material is selected from the group consisting of silver, cupric oxide, ruthenium dioxide, gold, copper, palladium, platinum and nickel or alloys thereof.

3. An assembly comprising a multilayer ceramic substrate having an insulating material formed of an insulating paste comprising an insulating powder and a via connection formed of a conductive paste extending within said insulating material, said conductive paste comprising:

an inorganic component which consists of 30.0 to 50.0% by weight of a powder of a conductive material and the remainder being a glass ceramic powder having a glass transition point higher than the starting point of sintering of said insulating powder; and an organic vehicle component which comprises an organic binder and solvent.

4. Conductive paste as claimed in claim 3, wherein the conductive material is selected from the group consisting of silver, cupric oxide, ruthenium dioxide, gold, copper, palladium, platinum and nickel or alloy thereof.

* * * * *